(12) United States Patent
Garvik (10) Patent No.: US 11,764,730 B2
(45) Date of Patent: Sep. 19, 2023

(54) OSCILLATOR CIRCUITS

(71) Applicant: Nordic Semiconductor ASA, Trondheim (NO)

(72) Inventor: Harald Garvik, Trondheim (NO)

(73) Assignee: Nordic Semiconductor ASA, Trondheim (NO)

(*) Notice: Subject to any disclaimer, the term of this patent is extended or adjusted under 35 U.S.C. 154(b) by 0 days.

(21) Appl. No.: 17/736,004

(22) Filed: May 3, 2022

(65) Prior Publication Data

US 2022/0360221 A1 Nov. 10, 2022

(30) Foreign Application Priority Data

May 6, 2021 (GB) ..................................... 2106467

(51) Int. Cl.
*H03B 5/36* (2006.01)
*H03L 7/099* (2006.01)
*H03B 5/06* (2006.01)
*H03B 5/02* (2006.01)
*H03B 5/32* (2006.01)

(52) U.S. Cl.
CPC ................ *H03B 5/36* (2013.01); *H03B 5/02* (2013.01); *H03B 5/06* (2013.01); *H03B 5/32* (2013.01); *H03B 5/364* (2013.01); *H03L 7/099* (2013.01); *H03B 2200/0082* (2013.01); *H03B 2200/0094* (2013.01)

(58) Field of Classification Search
CPC ............ H03L 7/099; H03B 2200/0094; H03B 2200/0082; H03B 5/364; H03B 5/06; H03B 5/36; H03B 5/02; H03B 5/32

USPC .................................. 331/167, 116 FE, 158
See application file for complete search history.

(56) References Cited

U.S. PATENT DOCUMENTS 3,848,200 A * 11/1974 Luscher ................... H03K 5/04
331/116 R
2006/0244546 A1 11/2006 Yamamoto
(Continued)

FOREIGN PATENT DOCUMENTS

CN 107 787 552 A 3/2018
CN 112491400 A 3/2021
EP 0 555 804 A1 8/1993

OTHER PUBLICATIONS

Hsiao, "A 1.89nW/0.15V Self-Charged XO for Real-Time Clock Generation," 2014 IEEE International Solid-State Circuits Conference, Feb. 11, 2014, 3 pages.
(Continued)

*Primary Examiner* — Arnold M Kinkead
(74) *Attorney, Agent, or Firm* — Klarquist Sparkman, LLP (57) ABSTRACT

A method of operating an oscillator circuit comprising a resonator is provided. The method comprises maintaining a resonance of the resonator by a) connecting the resonator to an input voltage ($V_{buf}$) for a first pulse period to charge the resonator only partially towards the input voltage ($V_{buf}$); b) connecting the resonator to a second, lower, voltage for a second pulse period to discharge the resonator at least partially; and repeating steps a) and b) at a rate corresponding to the resonance of the resonator and with a phase corresponding to the resonance of the resonator, so as to maintain the resonance of the resonator.

16 Claims, 4 Drawing Sheets

(56) References Cited

U.S. PATENT DOCUMENTS

2012/0154066 A1    6/2012   Kubota
2015/0207460 A1    7/2015   Yoon et al.

OTHER PUBLICATIONS

IPO Combined Search and Examination Report under Section 17 and 18(3) for GB2106467.0, dated Sep. 27, 2021, 5 pages.
Xu et al., "A 0.51nW 32kHz Crystal Oscillator Achieving 2ppb Allan Deviation Floor Using High-Energy-to-Noise-Ratio Pulse Injection," 2020 IEEE International Solid-State Circuits Conference, Feb. 17, 2020, 3 pages.
Yoon et al., "A 5.58 nW Crystal Oscillator Using Pulsed Driver for Real-Time Clocks," IEEE Journal of Solid-State Circuits, vol. 51, No. 2, Feb. 2016, 14 pages.
Zeng et al., A 1.7nW PLL-Assisted Current Injected 32KHz Crystal Oscillator for IoT, 2017 Symposium on VLSI Circuits Digest of Technical Papers, 2 pages.
Extended European Search Report for Great Britain Application No. 22171342.3, dated Oct. 6, 2022, 9 pages.

\* cited by examiner

OSCILLATOR CIRCUITS

CROSS-REFERENCE TO RELATED APPLICATION

This application claims priority to Great Britain Application No. 2106467.0, filed May 6, 2021, which application is incorporated herein by reference in its entirety.

FIELD

The present invention relates to oscillator circuits and methods of operating oscillator circuits.

BACKGROUND AND SUMMARY

Electronic oscillator circuits are commonplace in electronic devices, where they are used to generate clock signals and provide timing information. A common form of oscillator circuit is a crystal oscillator circuit, which comprises a piezoelectric crystal resonator (usually made of quartz) and a driving amplifier, which has its output fed back into its input via the crystal resonator. The crystal resonator acts as a very narrow filter, causing the circuit to oscillate at or near the resonant frequency of the crystal. Crystal resonators generally have a high Q factor and good temperature stability, which means they can be used to produce very stable clock signals.

However, crystal oscillator circuits typically require much more power to operate than equivalent non-crystal oscillators (e.g. an LC oscillator where a tuned LC circuit replaces the crystal), due to bias current losses in the driving amplifier (which is always powered), resistive losses in the rest of the circuit and power loss due to the piezoelectric movement of the crystal itself. For instance, an LC oscillator circuit might consume less than 1% of the power of an equivalent crystal oscillator circuit (albeit whilst providing less accurate timing).

Figure 1:
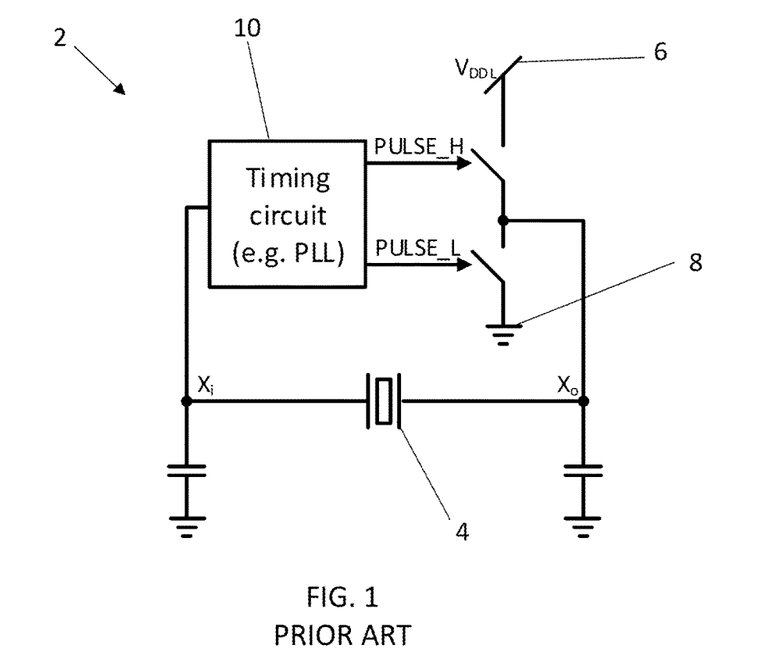
FIG. 1 is a schematic diagram of a pulse injection crystal oscillator circuit according to the prior art.
Figure 2:
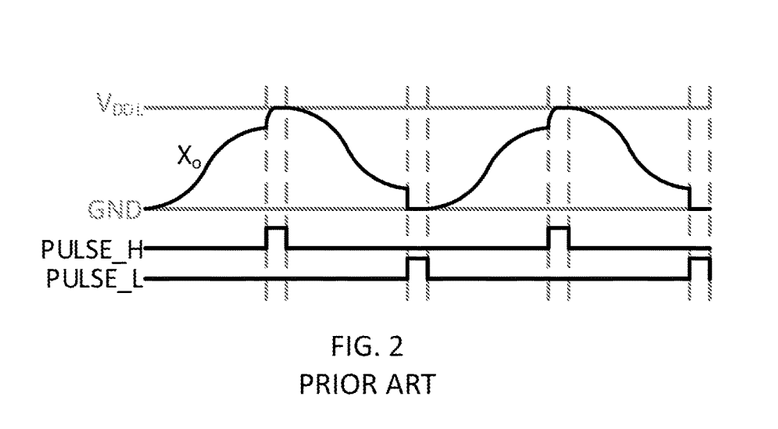
FIG. 2 is a timing diagram illustrating the operation of the pulse injection crystal oscillator circuit shown in FIG. 1.

A different approach to crystal oscillator circuits has been proposed. FIG. 1 shows a pulse injection crystal oscillator 2 (or PIXO) according to the prior art, in which a piezoelectric crystal 4 is alternately connected to a supply voltage rail 6 and a ground rail 8 for only short pulses (e.g. on the order of microseconds), at a rate locked to the resonance of the crystal using a timing circuit 10. The operation of the PIXO 2 is illustrated in FIG. 2, from which it can be seen that the voltage at node $X_0$ oscillates between the voltage $V_{DDL}$ of the supply voltage rail 6 and that of the ground rail 8. The crystal 4 is connected to the supply voltage rail 6 for a short period of time to charge the crystal 4 to the supply voltage $V_{DDL}$. Subsequently, the crystal is connected to ground 8 for another short period of time to discharge the crystal 4. This repeats at a rate corresponding to the resonance of the crystal 4 and phase-locked to the resonance of the crystal 4, which ensures that the crystal 4 continues to resonate without needing to continuously bias a driving amplifier. This reduces resistive losses and thus the overall power consumption of the crystal oscillator.

However, in such devices the supply voltage rail must be generated by sufficiently powerful circuitry to fully charge the crystal and its large load capacitance (e.g. typically more than 10 pF) during the short pulses. Thus whilst the overall power consumption is reduced, the instantaneous power requirements are relatively high, which can increase the cost and size of the PIXO or supporting circuitry. For instance, a switched capacitor network with several very large capacitors may be needed to generate the voltage rail.

According to a first aspect of the present invention there is provided a method of operating an oscillator circuit comprising a resonator, the method comprising maintaining a resonance of the resonator by:
a) connecting the resonator to an input voltage for a first pulse period to charge the resonator only partially towards the input voltage;
b) connecting the resonator to a second, lower, voltage for a second pulse period to discharge the resonator at least partially; and
repeating steps a) and b) at a rate corresponding to the resonance of the resonator and with a phase corresponding to the resonance of the resonator, so as to maintain the resonance of the resonator.

According to a second aspect of the present invention there is provided an oscillator circuit comprising a resonator, wherein the oscillator circuit is arranged to maintain a resonance of the resonator by:
a) connecting the resonator to an input voltage for a first pulse period to charge the resonator only partially towards the input voltage;
b) connecting the resonator to a second, lower, voltage for a second pulse period to discharge the resonator at least partially; and
repeating steps a) and b) at a rate corresponding to the resonance of the resonator and with a phase corresponding to the resonance of the resonator, so as to maintain the resonance of the resonator.

Thus, it will be seen by those skilled in the art that by driving the oscillator by only partially charging the resonator towards the input voltage in regular pulses (i.e. incomplete settling pulse injection), the instantaneous power demand of the oscillator circuit may be reduced. The Applicant has recognised that by partially charging the resonator consistently by repeatedly connecting it to the input voltage for the first pulse period, the oscillator circuit can still provide accurate timing but with reduced power consumption and a reduced instantaneous power demand. Power supply components with a smaller bandwidth may be used, reducing the size and/or cost of the oscillator circuit.

The present invention may be used with many different types of resonator, such as electronic circuits (e.g. an RC circuit or a tuned LC circuit) or dielectric resonators. However, in a preferred set of embodiments, the resonator comprises a piezoelectric material, for instance a quartz crystal. Piezoelectric resonators typically have a high Q factor and good temperature stability, allowing for excellent frequency stability. However, piezoelectric resonators can require more power to operate than other types of resonator, thus making them particularly suited to the power-saving benefits which may be achieved in accordance with the present invention.

The resonance of the resonator may occur at exactly an inherent resonant frequency of the resonator (e.g. a series resonant frequency). However in some embodiments it may be appropriate to maintain the resonance of the resonator at a slightly higher, or a slightly lower frequency near to the inherent resonant frequency.

The steps a) and b) are repeated at a rate corresponding to the resonance of the resonator. This may comprise repeating steps a) and b) at a rate that is equal or near to the frequency of the resonance of the resonator. However the steps a) and b) may alternatively be repeated at a rate equal or near to an integer multiple or division of the frequency of the resonance of the resonator.

The steps a) and b) are repeated with a phase corresponding to the resonance of the resonator, e.g. the first and second pulse periods are phase-locked (i.e. having a fixed phase relationship) to the resonance of the resonator with appropriate phase relationships for maintaining the resonance. This may comprise repeating step a) at or close to a peak of the resonance (e.g. approximately 90 degrees out of phase with a sinusoidal resonance of the resonator), and/or repeating step b) at or close to a lowest point of the resonance (e.g. approximately 270 degrees out of phase with a sinusoidal resonance of the resonator).

In accordance with the invention the resonator is charged in the first pulse period only partially towards the input voltage. In a set of embodiments it is charged to less than 80% of the input voltage, e.g. less than 65% of the input voltage, e.g. between 35% and 62% of the input voltage.

In some embodiments, the oscillator circuit comprises a buffer circuit arranged to provide the input voltage, i.e. such that the input voltage comprises a buffer voltage provided by the buffer circuit. The buffer circuit may comprise a voltage buffer. Using a stand-alone buffer circuit to inject charge into the resonator (e.g. rather than a separate reference voltage source that may be shared with other components) may allow the oscillator circuit to be made more robust to variations in the manufacturing process, supply voltage and/or the local temperature (PVT variations).

The buffer circuit may be arranged simply to transfer a supply voltage of the oscillator circuit, or an offset version of the supply voltage, as the buffer voltage. This may comprise a simple implementation of the buffer circuit.

However, in some embodiments the buffer circuit may be arranged to generate a reference voltage and transfer this reference voltage (or an offset version thereof) as the buffer voltage. The reference voltage may be lower than a supply voltage of the oscillator circuit.

Generating a stand-alone voltage reference may improve the stability of the oscillator circuit by reducing sensitivity to PVT variations, and by isolating the oscillator circuit from other potentially noisy circuit blocks that may share the same voltage supply. For instance, the buffer circuit may comprise a reference voltage portion arranged to generate a reference voltage that is substantially insensitive to temperature. The reference voltage portion may comprise one or more transistors arranged as a beta-multiplier circuit. The reference voltage portion may comprise a reference resistor, the resistance of which may be selected to achieve a desired reference voltage. The reference voltage portion may comprise a bias resistor arranged to offset the reference voltage. The bias resistor may comprise an adjustable bias resistor, e.g. to allow the reference voltage to be optimised for use with different resonators (e.g. crystals with different properties).

The buffer circuit may comprise a buffer portion arranged simply to transfer the reference voltage or an offset version of the reference voltage as the buffer voltage. For instance, the buffer portion may comprise a source follower transistor that has its gate terminal connected to the reference voltage (or an offset version thereof), and its drain terminal connected to a supply voltage of the oscillator circuit. The use of a source follower transistor may enable the buffer circuit to deliver more current to the resonator than its DC bias when the buffer voltage drops (i.e. on connection to the resonator in the first pulse period). In other words, the buffer circuit may operate as a class-AB buffer amplifier.

One or more component transistors of the voltage reference portion and the buffer portion of the buffer circuit may be matched (i.e. selected to have similar or identical characteristics to a greater extent than would be achieved through random selection of the components).

In some embodiments, the oscillator circuit comprises a buffer capacitor that is connected to the resonator during the first pulse period. In such embodiments, the buffer capacitor may form part of the buffer circuit. The buffer capacitor may act as a charge reservoir, storing charge between the first pulse periods and then delivering this charge to the resonator in the first pulse periods. This may further reduce the peak current demand on power supply components, as at least some of the charge required to partially charge the resonator in the first pulse period is provided by the buffer capacitor, reducing the charge that the power supply components need to deliver during the first pulse period.

The buffer capacitor may be recharged between the first pulse periods. For instance, the buffer capacitor may be permanently connected between the input voltage and a lower voltage (e.g. the second voltage or a ground voltage), such that it is charged to or towards the input voltage between the first pulse periods, and connected to the resonator to deliver the stored charge thereto during the first pulse periods.

The charge delivered by the buffer capacitor during the first pulse period may be provided gradually to the capacitor between the first pulse periods, i.e. requiring only a small charging current. In some embodiments the buffer capacitor may provide most or even all of the charge required to partially charge the resonator during the first pulse period.

The buffer capacitor may be able to deliver the charge required to partially charge the resonator very quickly, potentially allowing the duration of the first pulse period to be reduced. This may further reducing the overall power consumption of the oscillator circuit. Embodiments featuring a buffer circuit that charges the buffer capacitor between the first pulse periods enable the buffer circuit to do useful work throughout the entire cycle of the resonator.

The buffer capacitor may have a capacitance that is less than, and possibly significantly less than, a load capacitance of the resonator, so as to charge the resonator only partially during the first pulse period. For instance, the buffer capacitor may have a capacitance of less than 5 pF, e.g. 1.4 pF. A typical crystal resonator may comprise more than 10 pF of load capacitance per side.

In some embodiments, the oscillator circuit comprises a timing circuit arranged to time the first and second pulse periods (i.e. to ensure they repeat at a rate corresponding to the resonance of the resonator, and with a phase corresponding to the resonance of the resonator). The timing circuit may comprise a feedback loop arranged to synchronise the first and second pulse periods with the resonance of the resonator. For instance, the timing circuit may be arranged to receive a resonance signal from the resonator as an input and to control the timing of the first and second pulse periods to correspond with the resonance signal. The timing circuit may comprise a phase locked loop or a delay locked loop.

Some embodiments may comprise providing an initial resonance signal to start oscillations of the oscillator circuit from an initial zero oscillation state (i.e. a start-up signal to cold-start the oscillator circuit). The initial resonance signal may be provided from an external source, but in at least some embodiments the oscillator circuit comprises a start-up circuit arranged to provide an initial resonance signal to initiate operation of the oscillator circuit. The start-up circuit may comprise a Pierce oscillator. Providing an initial resonance signal to start-up the resonance may be particularly beneficial in embodiments where the timing of steps a) and b) is controlled using the resonance of the resonator itself (e.g. embodiments featuring a timing circuit that receives a resonance signal from the resonator as an input).

The first pulse period may have a duration on the order of microseconds. The first and second pulse periods may have approximately or fully equal durations. This may simplify the circuitry required to time the first and second pulse periods, e.g. allowing common timing components to be used to time the first and second pulse periods.

Alternatively, the first and second pulse periods may have different durations. This may allow for the power consumption and/or size of the oscillator circuit to be further optimised. For instance, the first pulse period may be longer than the second pulse period, e.g. where circuitry used to discharge the resonator has a higher bandwidth than the circuitry used to charge the resonator. Conversely, the first pulse period may be shorter than the second pulse period.

Features of any aspect or embodiment described herein may, wherever appropriate, be applied to any other aspect or embodiment described herein. Where reference is made to different embodiments, it should be understood that these are not necessarily distinct but may overlap.

BRIEF DESCRIPTION OF THE DRAWINGS

One or more non-limiting examples will now be described, by way of example only, and with reference to the accompanying figures in which.

DETAILED DESCRIPTION

Figure 3:
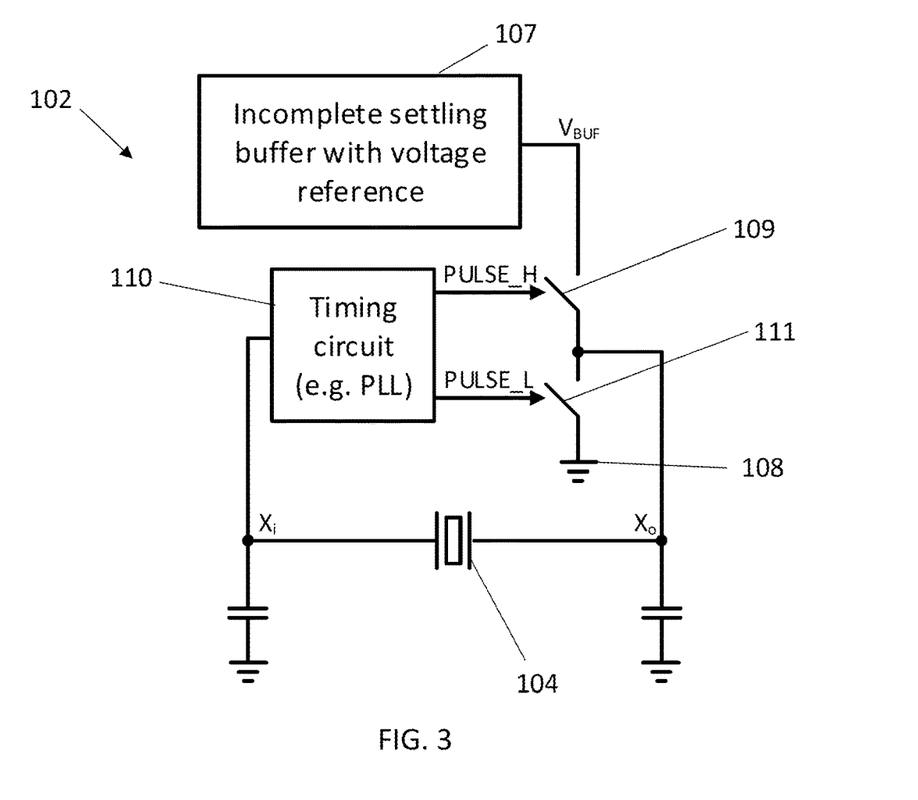
FIG. 3 is a schematic diagram of a pulse injection crystal oscillator circuit according to an embodiment of the invention.

FIG. 3 shows a pulse injection crystal oscillator circuit 102 that comprises a piezoelectric crystal resonator 104, a buffer circuit 107, and a timing circuit 110.

The operation of the pulse injection crystal oscillator circuit 102 will now be described with reference to the timing diagram shown in FIG. 4. In use, the timing circuit 110 alternately connects the crystal resonator 104 to the buffer circuit 107 using a high switch 109 and to a ground rail 108 using a low switch 111, at a rate that corresponds to a resonance of the crystal resonator 104, and with a phase corresponding to the resonance of the resonator.

Figure 4:
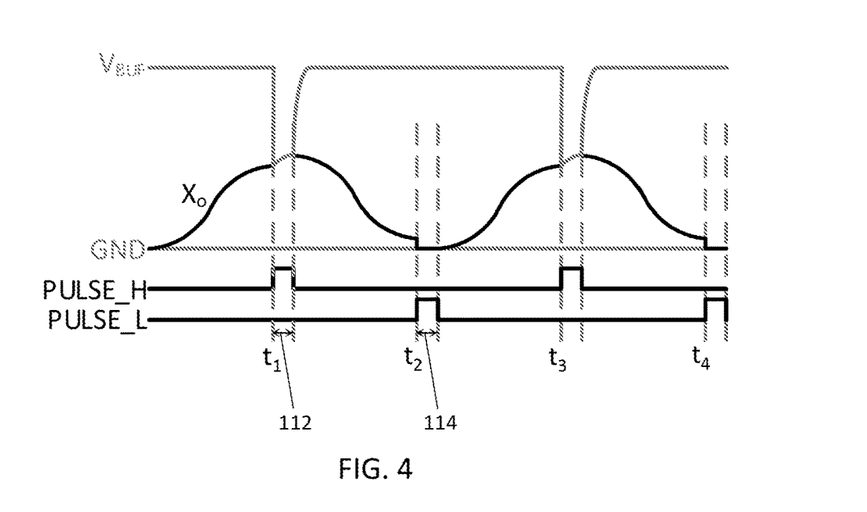
FIG. 4 is a timing diagram illustrating the operation of the pulse injection crystal oscillator circuit shown in FIG. 3.

As shown in FIG. 4, the voltage of the crystal oscillator 104, measured at node $X_0$ oscillates at the frequency of the resonance of the crystal resonator 104. The timing circuit 110 is locked to the resonance of the crystal resonator 104 (e.g. using a phase locked loop).

At a first time $t_1$, the timing circuit 110 connects the crystal resonator 104 to a buffer voltage $V_{BUF}$ generated by the buffer circuit 107 for a first pulse period 112. During the first pulse period 112, the current provided by the buffer circuit 107 charges the crystal resonator 104 partially, but not completely, towards the buffer voltage $V_{BUF}$ (e.g. to between 35% and 62% of $V_{BUF}$). Because the crystal resonator 104 is only partially charged towards the buffer voltage $V_{BUF}$, the charging current provided by the buffer circuit 107 can be relatively small.

At a second time $t_2$, which is half of the resonant period of the crystal resonator 104 after $t_1$, the timing circuit 110 connects the crystal resonator 104 to the ground rail 108 for a second pulse period 114. This quickly discharges the crystal resonator 104. Whilst in the example shown in FIG. 4 the crystal resonator 104 is completely discharged in the second pulse period 114, this is not essential. FIG. 4 shows the first and second pulse periods 112, 114 as equal, but again this is not essential. For instance, the second pulse period 114 may be shorter than the first pulse period 112.

The duration of the first pulse period 112, and the current bandwidth of the buffer circuit 107 are chosen to ensure that the charge delivered to the crystal resonator 104 is sufficient to keep the oscillation going, whilst minimising the physical size of the buffer 107 and the overall power consumption of the oscillator circuit 102.

The output $X_i$ of the crystal resonator 104 is connected to the timing circuit 110, which controls the process to repeat at a rate corresponding to the resonance of the crystal resonator 104 and phase-locked with the resonance of the crystal resonator 104 (i.e. with the first pules period 112 occurring at or close to the peak of the oscillation waveform, and the second pulse period 114 occurring at or close to the bottom of the oscillation waveform). This maintains the oscillation indefinitely. In this example the first and second pulse periods 112, 114 repeat at a rate slightly above the inherent resonant frequency of the crystal resonator 104. The timing circuit 110 may, for instance, comprise a phase locked loop (PLL).

Figure 5:
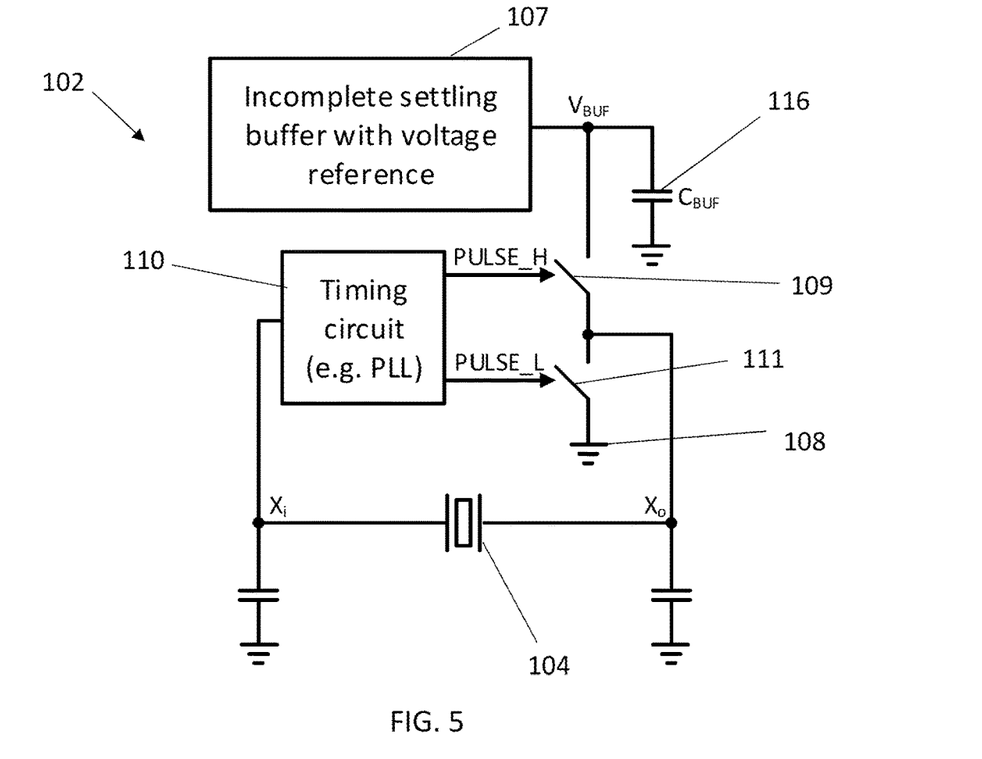
FIG. 5 is a schematic diagram of a pulse injection crystal oscillator circuit according to another embodiment of the invention.

Another embodiment of the pulse injection crystal oscillator circuit 102 is shown in FIG. 5. In this embodiment the pulse injection crystal oscillator circuit 102 additionally comprises a buffer capacitor 116. Although it is shown separately in FIG. 5, the buffer capacitor 116 may be considered to form part of the buffer circuit 107.

Figure 6:
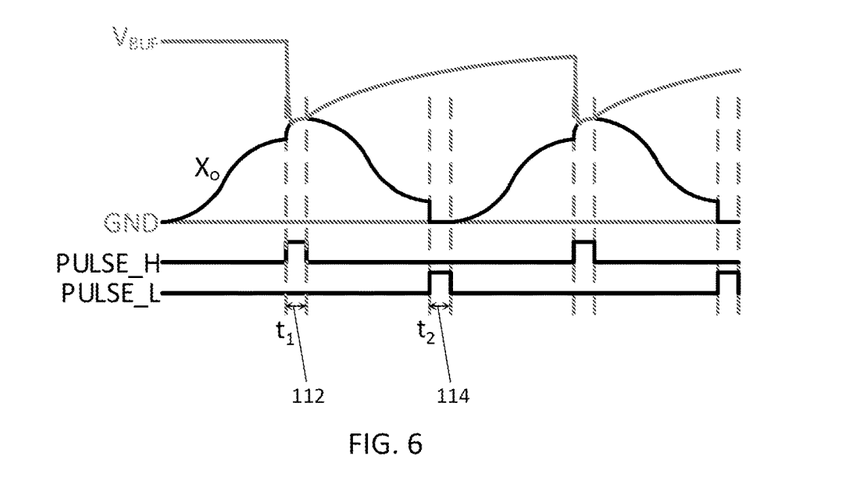
FIG. 6 is a timing diagram illustrating the operation of the pulse injection crystal oscillator circuit shown in FIG. 5.

The operation of the pulse injection crystal oscillator circuit 102 shown in FIG. 5 will now be described with reference to the timing diagram shown in FIG. 6.

As with the previous embodiment, the voltage of the crystal oscillator 104, measured at node $X_0$ oscillates at the frequency of the resonance of the crystal resonator 104. The timing circuit 110 is locked to the resonance of the crystal resonator 104 (e.g. because it comprises a phase locked loop).

At a first time $t_1$, the timing circuit 110 closes the high switch 109 to connect the crystal resonator 104 to a buffer voltage $V_{BUF}$ generated by the buffer circuit 107 for a first pulse period 112. Charge stored in the buffer capacitor 116 is quickly delivered to the crystal resonator 104, which quickly raises the voltage at node $X_0$ partially towards the buffer voltage $V_{BUF}$. FIG. 6 shows that after this initial rise the buffer circuit 107 continues to charge the crystal resonator 104 towards the buffer voltage at a slower rate. At the end of the first pulse period 112 the timing circuit 110 opens the high switch 109 to disconnect the crystal resonator 104 from the buffer voltage $V_{BUF}$, and the buffer circuit 107 begins to gradually recharge the buffer capacitor 116 back to the buffer voltage $V_{BUF}$.

At a second time $t_2$, which is half of the resonant period of the crystal resonator 104 after $t_1$, the timing circuit 110 closes the low switch 111 to connect the crystal resonator 104 to the ground rail 108 for a second pulse period 114. This quickly discharges the crystal resonator 104. Whilst in the example shown in FIG. 4 the crystal resonator 104 is completely discharged in the second pulse period 114, this is not essential. FIG. 4 shows the first and second pulse periods 112, 114 as equal, but again this is not essential. For instance, the second pulse period 114 may be shorter than the first pulse period 112.

In this embodiment, the use of the buffer capacitor 116 allows charge to be quickly delivered to the crystal resonator 104 in the first pulse period 112. Although this is not shown in FIG. 6, this may allow the duration of the first pulse period 112 to be reduced compared to the embodiment described with reference to FIG. 4. This can further reduce the overall power use of the oscillator circuit 102.

Furthermore, the peak current delivery required of the buffer circuit 107 can be further reduced in this embodiment because it does useful work charging the buffer capacitor 116 throughout the entire resonant cycle before the first pulse period 112 occurs again. FIG. 6 shows how the buffer circuit 107 gradually recharges the buffer capacitor 116. This may allow the physical size and cost of the buffer circuit 107 to be even further reduced.

Figure 7:
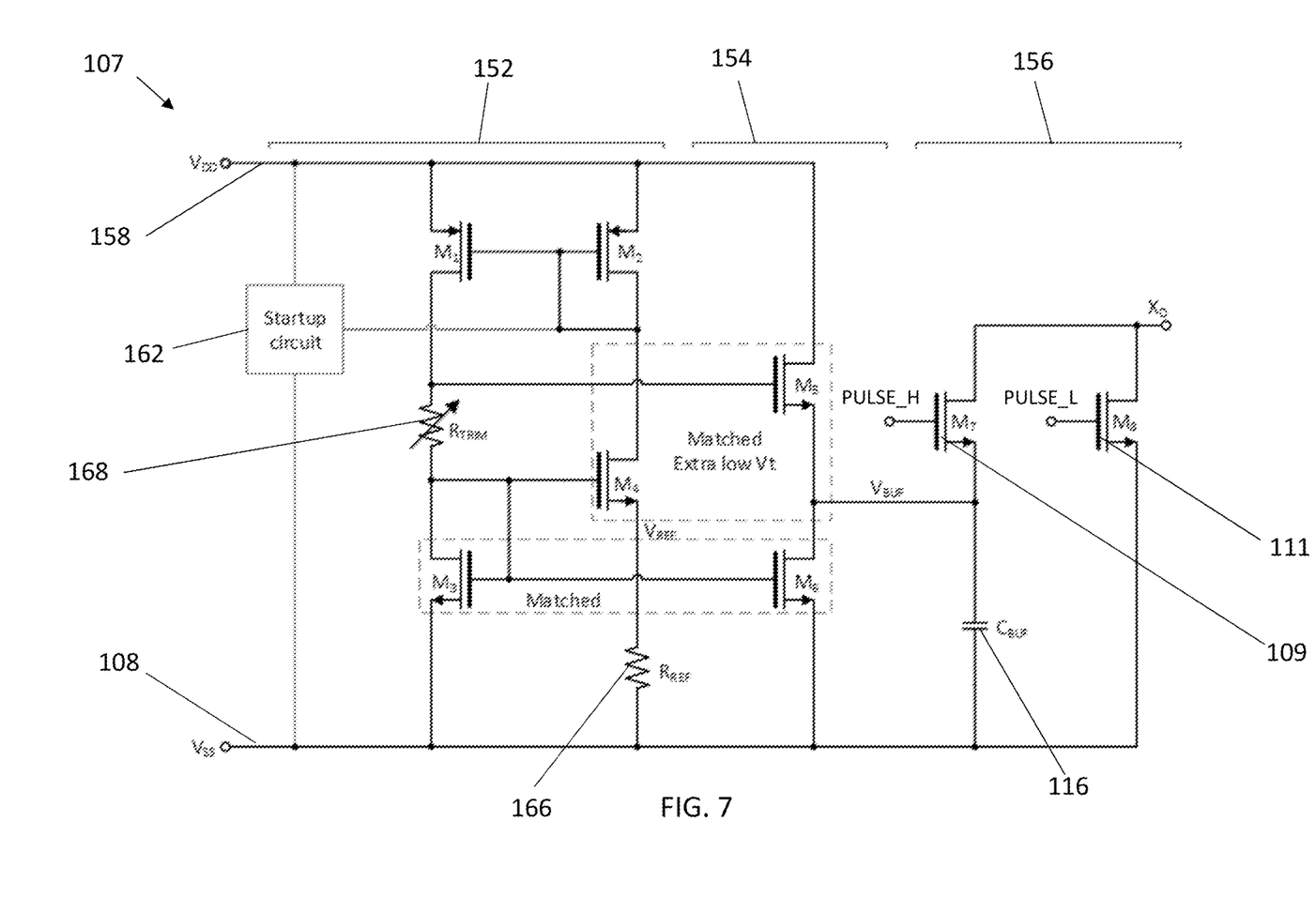
FIG. 7 is a schematic diagram of the buffer circuit of the pulse injection crystal oscillator circuit shown in FIG. 5.

FIG. 7 shows a detailed schematic diagram of the buffer circuit 107. The buffer circuit 107 comprises an input voltage rail 158 (which is at voltage $V_{DD}$) and a ground rail 108 (at voltage $V_{SS}$). The buffer circuit 107 comprises three portions: a current/voltage reference portion 152, a buffer portion 154 and a switching portion 156. Some or all of the portions 152, 154, 156 may be physically separate (e.g. all the portions of the buffer circuit 107 may not be located on a single integrated circuit).

The current/voltage reference portion 152 comprises a startup circuit 162, transistors $M_1$-$M_4$, a reference resistor 166 (with resistance $R_{REF}$), and a trim resistor 168 (with resistance $R_{TRIM}$). The current/voltage reference portion 152 is configured as a beta-multiplier circuit.

The buffer portion 154 comprises a source follower transistor $M_5$ and a biasing transistor $M_6$.

The switching portion 156 comprises the high switch 109, which comprises a first switching transistor $M_7$ arranged to connect the crystal resonator 104 to the buffer voltage $V_{BUF}$, and the low switch 111, which comprises a second switching transistor $M_8$ arranged to connect the crystal resonator 104 to the ground rail 108.

The buffer circuit 107 further comprises the buffer capacitor 116, connected between the source of the first switching transistor $M_7$ (i.e. the output of the buffer portion 154) and the ground rail 108. The first and second switching transistors $M_7$, $M_8$ are controlled by pulses from the timing circuit 110.

In use, the current/voltage reference portion 152 generates a reference voltage $V_{REF}$. The bias current generated by the current/voltage reference portion is set by the relative sizing of the transistors $M_{3-4}$ and the resistance $R_{REF}$ of the reference resistor 166. By choosing the size of the transistors M1-4 and resistor 166 correctly, the reference voltage $V_{REF}$ may be made to be temperature independent The startup circuit 162 ensures that the current/voltage reference portion produces the reference voltage $V_{REF}$ rather than an alternative steady-state where zero current flows.

In use, the buffer portion 154 operates as a voltage buffer. By matching the transistors $M_3$ and $M_4$ of the current/voltage reference portion 152 with the source follower transistor $M_5$ and the biasing transistor $M_6$ respectively, $V_{REF}$ is copied to $V_{BUF}$, offset by the voltage drop across $R_{TRIM}$.

The configuration of the buffer circuit 107 ensures that $V_{BUF}$ is generated with acceptable PVT robustness (i.e. the buffer voltage is largely independent of variations in the manufacturing process, the supply voltage $V_{SS}$ and the temperature). By configuring the buffer portion 154 as a source follower connected directly to the voltage supply rail 158, it can supply more current than its DC bias when $V_{BUF}$ drops (i.e. acting as an AB-like amplifier), meaning that the bias current consumed by the buffer can be further reduced. In one example in which the oscillator circuit 102 oscillates at approximately 32 kHz, the bias current in each branch of the buffer circuit 107 is about 2.5 nA, meaning that the whole circuit uses only 7.5 nA of bias current.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A method of operating an oscillator circuit comprising a resonator, the method comprising maintaining a resonance of the resonator by:
   a) connecting the resonator to an input voltage for a first pulse period to charge the resonator only partially towards the input voltage, and disconnecting the resonator from the input voltage at an end of the first pulse period;
   b) connecting the resonator to a second, lower, voltage for a second pulse period to discharge the resonator at least partially, and disconnecting the resonator from the second voltage at an end of the second pulse period; and
   repeating steps a) and b) at a rate corresponding to the resonance of the resonator and with a phase corresponding to the resonance of the resonator, so as to maintain the resonance of the resonators;
   wherein the method comprises charging the resonator in the first pulse period to less than 80% of the input voltage.

2. The method as claimed in claim 1, wherein the resonator comprises a piezoelectric material.

3. The method as claimed in claim 1, wherein the input voltage comprises a buffer voltage provided by a buffer circuit.

4. The method as claimed in claim 3, wherein the buffer voltage comprises a reference voltage generated by a reference voltage portion of the buffer circuit, or an offset version of a reference voltage generated by a reference voltage portion of the buffer circuit.

5. The method as claimed in claim 4, wherein the reference voltage is lower than a supply voltage of the oscillator circuit.

6. The method as claimed in claim 4, wherein the reference voltage portion comprises an adjustable bias resistor arranged to offset the reference voltage.

7. The method as claimed in claim 4, wherein the buffer circuit comprises a buffer portion comprising a source follower transistor that has its gate terminal connected to the reference voltage or an offset version of the reference voltage, and its drain terminal connected to a supply voltage of the oscillator circuit.

8. The method as claimed in claim 7, wherein one or more component transistors of the voltage reference portion and the buffer portion of the buffer circuit are matched.

9. The method as claimed in claim 1, comprising connecting a buffer capacitor to the resonator during the first pulse period.

10. The method as claimed in claim 9, comprising recharging the buffer capacitor between the first pulse periods.

11. The method as claimed in claim 1, comprising timing the first and second pulse periods using a timing circuit, the timing circuit comprising a feedback loop arranged to synchronise the first and second pulse periods with the resonance of the resonator.

12. The method as claimed in claim 11, wherein the timing circuit comprises a phase locked loop or a delay locked loop.

13. The method as claimed in claim 1, comprising providing an initial resonance signal to start oscillations of the oscillator circuit from an initial zero oscillation state.

14. An oscillator circuit comprising a resonator, wherein the oscillator circuit is arranged to maintain a resonance of the resonator by:
  a) connecting the resonator to an input voltage for a first pulse period to charge the resonator only partially towards the input voltage, and disconnecting the resonator from the input voltage at an end of the first pulse period;
  b) connecting the resonator to a second, lower, voltage for a second pulse period to discharge the resonator at least partially, and disconnecting the resonator from the second voltage at an end of the second pulse period; and
  repeating steps a) and b) at a rate corresponding to the resonance of the resonator and with a phase corresponding to the resonance of the resonator, so as to maintain the resonance of the resonators;
  wherein the oscillator circuit is arranged to charge the resonator in the first pulse period to less than 80% of the input voltage.

15. A method of operating an oscillator circuit comprising a resonator, the method comprising maintaining a resonance of the resonator by:
  a) connecting the resonator to an input voltage for a first pulse period to charge the resonator only partially towards the input voltage, and disconnecting the resonator from the input voltage at an end of the first pulse period;
  b) connecting the resonator to a second, lower, voltage for a second pulse period to discharge the resonator at least partially, and disconnecting the resonator from the second voltage at an end of the second pulse period; and
  repeating steps a) and b) at a rate corresponding to the resonance of the resonator and with a phase corresponding to the resonance of the resonator, so as to maintain the resonance of the resonator;
  wherein the method comprises timing the first and second pulse periods using a timing circuit, the timing circuit comprising a feedback loop arranged to synchronise the first and second pulse periods with the resonance of the resonator.

16. A method of operating an oscillator circuit comprising a resonator, the method comprising maintaining a resonance of the resonator by:
  a) connecting the resonator to an input voltage for a first pulse period to charge the resonator only partially towards the input voltage, and disconnecting the resonator from the input voltage at an end of the first pulse period;
  b) connecting the resonator to a second, lower, voltage for a second pulse period to discharge the resonator at least partially, and disconnecting the resonator from the second voltage at an end of the second pulse period; and
  repeating steps a) and b) at a rate corresponding to the resonance of the resonator and with a phase corresponding to the resonance of the resonator, so as to maintain the resonance of the resonator;
  wherein the method comprises providing an initial resonance signal to start oscillations of the oscillator circuit from an initial zero oscillation state.

* * * * *